United States Patent [19]

Imai et al.

[11] Patent Number: 5,202,221
[45] Date of Patent: Apr. 13, 1993

[54] LIGHT-SENSITIVE COMPOSITION

[75] Inventors: Masanori Imai; Noriaki Watanabe; Kouichi Kawamura, all of Shizuoka, Japan

[73] Assignee: Fuji Photo Film Co., Ltd., Minami-ashigara, Japan

[21] Appl. No.: 433,975

[22] Filed: Nov. 9, 1989

[30] Foreign Application Priority Data

Nov. 11, 1988 [JP] Japan .................................. 63-285404
Nov. 14, 1988 [JP] Japan .................................. 63-287115
Apr. 13, 1989 [JP] Japan .................................. 1-93647

[51] Int. Cl.$^5$ ......................... G03F 7/038; G03C 1/52; G03C 1/60
[52] U.S. Cl. ................................... 430/283; 430/192; 430/197; 430/287; 430/926; 430/920; 430/176; 522/9; 522/13; 522/16; 522/26; 522/34; 522/35; 522/50; 522/51; 522/63; 522/14
[58] Field of Search ............... 430/287, 283, 176, 192, 430/197, 926, 920; 522/9, 13, 16, 26, 34, 35, 50, 51, 63, 14

[56] References Cited

U.S. PATENT DOCUMENTS

| | | | |
|---|---|---|---|
| 2,732,301 | 1/1956 | Robertson et al. | 95/7 |
| 3,528,812 | 9/1970 | Danhäuser et al. | 522/50 X |
| 3,615,453 | 10/1971 | Jenkins et al. | |
| 3,870,524 | 3/1975 | Watanabe et al. | 430/920 X |
| 4,062,686 | 12/1977 | Van Allan et al. | 430/287 X |
| 4,158,731 | 6/1979 | Baumann et al. | 430/283 X |
| 4,239,850 | 12/1980 | Kita et al. | 522/121 X |
| 4,481,340 | 11/1984 | Minnema et al. | 430/283 X |
| 4,626,497 | 12/1986 | Roth et al. | |
| 4,636,459 | 1/1987 | Kawamura et al. | 430/288 |
| 4,661,435 | 4/1987 | Minnema et al. | 430/197 X |
| 4,845,009 | 7/1989 | Kita et al. | 430/192 X |
| 4,917,977 | 4/1990 | Smothers | 522/63 X |

FOREIGN PATENT DOCUMENTS

| | | |
|---|---|---|
| 0021019 | 1/1981 | European Pat. Off. |
| 0333156 | 9/1989 | European Pat. Off. |
| 1950785 | 4/1970 | Fed. Rep. of Germany |
| 3633456 | 2/1987 | Fed. Rep. of Germany |
| 3719355 | 12/1987 | Fed. Rep. of Germany |
| 53-33287 | 3/1978 | Japan ........................... 522/26 |
| 62-294238 | 12/1987 | Japan |
| 1150987 | 5/1969 | United Kingdom ............... 522/50 |

OTHER PUBLICATIONS

Hans Zweifel, "Polymer with Pendent Dimethylmaleimide Groups as Highly Sensitive Photo Crosslinkable Systems" *Photographic Science and Engineering,* vol. 27, No. 3, May 1983, pp. 114–118.

Jaromir Kosar, *Light-Sensitive Systems: Chemistry and Application of Non silver Halide Photographic Processes,* John Wiley & Sons, Inc., New York, N.Y. 1965, pp. 143–146, 160–193.

*Primary Examiner*—Cynthia Hamilton
*Attorney, Agent, or Firm*—Burns, Doane, Swecker & Mathis

[57] ABSTRACT

The present invention relates to a light-sensitive composition comprising (a) a photo-crosslinkable polymer having a maleimido group at a side chain and (b) a sensitizer such as the following compounds:

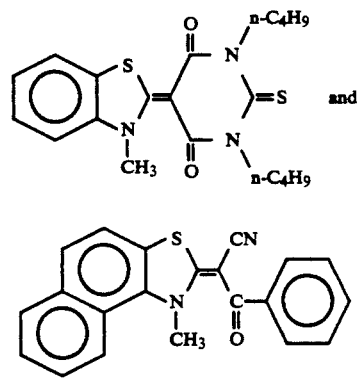

The present invention provides a light-sensitive composition having very high sensitivity; providing excellent images during only a short exposure time; and being sensitive to light of long wave length.

12 Claims, No Drawings

LIGHT-SENSITIVE COMPOSITION

BACKGROUND OF THE INVENTION

The present invention relates to a photo-crosslinkable light-sensitive composition capable of being crosslinked through a cyclization-addition reaction and more specifically to a light-sensitive composition which comprises a photo-crosslinkable polymer having a maleimido group at a side chain and a novel sensitizer, in particular to a light-sensitive composition useful for preparing a light-sensitive layer of light-sensitive lithographic printing plates, photoresist layers, or the like.

Photo-crosslinkable materials which are cross-linked through a cyclization-addition reaction have been well known and been used as a main component of light-sensitive compositions for making light-sensitive lithographic printing plates (hereunder referred to as "PS plates"), photoresists and the like. Among these crosslinkable materials, photo-crosslinkable polymers having a maleimido group at a side chain do not exhibit sufficient light-sensitivity and, therefore, a sensitizer such as thioxanthones, benzophenones, Michler's ketones, anthraquinones, anthracenes, chrysenes, p-dinitrobenzenes or 2-nitrofluorenones has been used as a sensitizer to enhance the light-sensitivity of such polymers. The light-sensitivity of the polymers is enhanced by the addition of such a sensitizer, but is still insufficient. Moreover, since it takes a long period of time to conduct imagewise exposure for forming images, the workability thereof is insufficient and images of good quality cannot be reproduced if there is slight vibration in the operations for obtaining fine images.

In addition, these sensitizers only absorb light having short wave length and its $\lambda_{max}$ is at most about 400 nm. Therefore, light sources are much limited for exposing the composition containing such sensitizers.

To eliminate the foregoing disadvantages, it has been proposed to use, as a sensitizer, a compound represented by the following general formula:

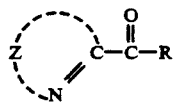

(in the formula, Z represents a group of nonmetallic atoms required for forming a heterocyclic nucleus including a nitrogen atom and R represents a substituted or unsubstituted aryl group or a substituted or unsubstituted heterocyclic ring) in Japanese Patent Unexamined Publication (hereunder referred to as "J.P. KOKAI") No. Sho 62-294238.

However, these sensitizers also absorb only light having a short wave length and the $\lambda_{max}$ thereof is at most about 400 nm. Moreover, the sensitivity thereof is still insufficient.

SUMMARY OF THE INVENTION

Accordingly, an object of the present invention is to provide a light-sensitive composition having high sensitivity and more specifically to provide a photo-crosslinkable light-sensitive composition containing a photo-crosslinkable polymer having a maleimido group at a side chain and a sensitizer capable of improving the photo-crosslinking rate of the composition containing such a polymer.

Another object of the present invention is to provide a light-sensitive composition which has high sensitivity and which is sensitive to light having a long wave length, and more specifically to provide a photo-crosslinkable light-sensitive composition containing a photo-crosslinkable polymer and a sensitizer capable of improving the photo-crosslinking rate of the polymer and being sensitive to light having a long wave length.

The inventors of this invention have conducted various and intensive studies to achieve the foregoing objects and, as a result, have found out that specific sensitizers are sensitive to light from wide variety of light sources and improve the photo-crosslinking rate of a photo-crosslinkable light-sensitive composition containing a photo-crosslinkable polymer having a maleimido group at a side chain. The present invention has been completed based on this finding.

Namely, the present invention relates to a light-sensitive composition which comprises:

(a) a photo-crosslinkable polymer having a maleimido group at a side chain, and (b) a sensitizer selected from the group consisting of those represented by the following general formulae (I) and (II):

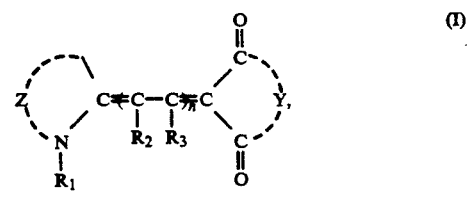

and

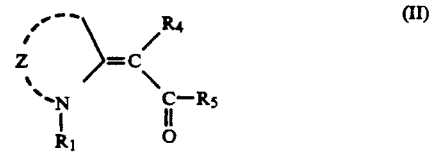

wherein Z represents a group of nonmetallic atoms required for forming a heterocyclic nucleus containing a nitrogen atom; Y represents a group of nonmetallic atoms required for forming a ring; $R_1$ represents a substituted or unsubstituted alkyl group; $R_2$ and $R_3$ may be the same as or different from each other and each represents a hydrogen atom, a substituted or unsubstituted alkyl group, a substituted or unsubstituted aryl group or a halogen atom; $R_4$ represents a hydrogen atom, a halogen atom, a cyano group or a group of —CO—$R_6$ ($R_6$ represents an alkyl group, an aryl group or a heterocyclic group, which may have substituents); and $R_5$ represents an alkyl group, an aryl group or a heterocyclic group, which may have substituents; and n is an integer of 0 to 4.

DETAILED EXPLANATION OF THE INVENTION

The light-sensitive composition of the present invention will hereunder be described in more detail.

The present photo-crosslinkable polymers having a maleimido group at a side chain include those having, at a side chain, a maleimido group represented by the following general formula (A):

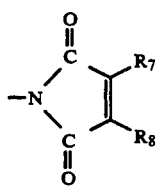

(A)

In the above formula, R₇ and R₈ may be the same as or different from each other and each represents a hydrogen atom, a halogen atom or an alkyl group. R₇ and R₈ may form a 5-membered or 6-membered ring. The alkyl group of R₇ and R₈ are preferably those having 1 to 4 carbon atoms, in particular a methyl group. The halogen atom is preferably a chlorine, bromine or iodine atom. Those polymers are disclosed in, for instance, J. P. KOKAI No. Sho 52-988 (corresponding to U.S. Pat. No. 4,079,041); German Patent No. 2,626,769; European Patent Nos. 21,019 and 3,552; Die Angewandte Makromolekulare Chemie, 1983, 115, pp. 163–181; J. P. KOKAI Nos. Sho 49-128991 to Sho 49-128993, Sho 50-5376 to Sho 50-5380, Sho 53-5298 to Sho 53-5300, Sho 50-50107, Sho 51-47940, Sho 52-13907, Sho 50-45076, Sho 52-121700, Sho 50-10884 and Sho 50-45087; and German Patent Nos. 2,349,948 and 2,616,276. It is preferable that the polymer (a) should have, at a side chain, at least two maleimido groups per molecule on the average and have an average molecular weight of 1,000 or higher.

These polymers may easily be prepared by copolymerizing a monomer selected from the group consisting of those represented by the following general formulae (B) to (D):

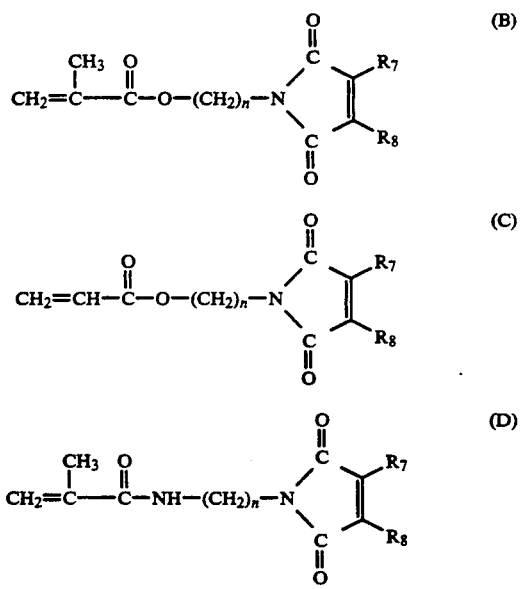

(wherein R₇ and R₈ each has the same meanings as defined in the general formula (A) and n is an integer preferably ranging from 1 to 6), with a monomer having an alkali-soluble group in a molecule, at a molar ratio, for instance, ranging from 95/5 to 30/70 and preferably 90/10 to 70/30. The polymers having acidic groups are preferable, because they can be developed with an alkaline water and they make it advantageous in view of environmental pollution.

The acid value of the polymers having acidic groups preferably ranges from 20 to 250 and more preferably 50 to 150. Examples of the copolymerizable monomers having an alkai-soluble group are vinyl monomers having a carboxyl group such as acrylic acid and methacrylic acid, maleic anhydride and itaconic anhydride.

In particular, the polymers (a) are copolymers of N-[2-(methacryloyloxy) ethyl]-2,3-dimethylmaleimide with methacrylic acid or acrylic acid as disclosed in Die Angewandte Makromolekulare Chemie, 1984, 128, pp. 71-91, in other words copolymers of such maleimide with a monomer having an alkali-soluble group. In addition, it is also preferable to use multicomponent copolymers obtained by polymerizing the foregoing monomers in the presence of vinyl monomers other than the foregoing vinyl monomers.

It is desirable in the present invention to use those having a molecular weight of 1,000 or higher, preferably 10,000 to 500,000, in particular 20,000 to 300,000 as the polymer (a).

The polymer (a) is generally incorporated into the light-sensitive composition in an amount of 10 to 99% by weight (hereunder referred to as simply "%") and preferably 50 to 99% based on the total composition.

The component (b) of the present light-sensitive composition, i.e., the sensitizer will now be explained in more detail below.

One of the present sensitizers is represented by the following general formula (I):

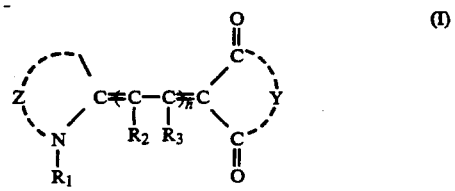

(I)

wherein Z is a group of nonmetallic atoms required for forming a heterocyclic nucleus containing a nitrogen atom, which is usually used in cyanine dyes. Examples of the heterocyclic nuclei containing Z and a nitrogen atom include benzothiazoles such as benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-hydroxybenzothiazole, 5,6-di methylbenzothiazole and 5,6-dimethoxybenzothiazole; naphthothiazoles such as α-naphthothiazole and β-naphthothiazole; benzoselenazoles such as benzoselenazole, 5-chlorobenzoselenazole, 6-m ethylbenzoselenazole and 6-methoxybenzoselenazole; naphthoselenazoles such as α-naphthoselebazole and β-naphthoselenazole; benzoxazoles such as benzoxazole, 5-methylbenzoxazole, 5-phenylbenzoxazole and 6-methoxybenzoxazole; naphthoxazoles such as α-naphthoxazole and β-naphthoxazole; imidazoles such as imidazole and benzimidazole; isoindoles such as 3,3-dimethylindolenine; quinolines such as quinoline and isoquinoline; diazoles such as 1,3,4-oxadiazole, 1,3,4-thiadiazole and 1,3,4-selenadiazole; triazoles such as 1,2,4-triazole; pyrazines; quinoxalines; s-triazines; and phenanthridines. These heterocyclic nuclei may have substituents, for instance, alkyl groups having 1 to 6 carbon atoms such as methyl and ethyl groups; alkoxy groups having 1 to 6 carbon atoms such as methoxy and ethoxy groups; halogen atoms such as chlorine and bromine atoms; cyano group; amino group; amino groups substituted with groups selected from alkyl groups having 1 to 4 carbon atoms such as a dimethylamino group; carboalkoxy groups having an alkyl group having 1 to 4 carbon atoms such as a carbomethoxy group; and substituted and unsubstituted aryl groups such as a phenyl group, a p-methoxyphenyl group and a p-chlorophenyl group.

Y represents a group of nonmetallic atoms required for forming a ring and forms, for instance, those having the following structures (i) to (v).

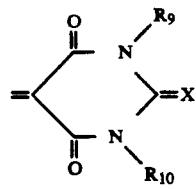

(i)

wherein $R_9$ and $R_{10}$ each independently represents a hydrogen atom, a substituted or unsubstituted alkyl group, a substituted or unsubstituted aryl group or a substituted or unsubstituted allyl group and X represents an oxygen or sulfur atom;

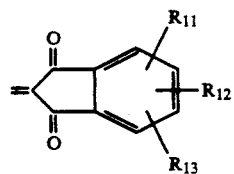

(ii)

wherein $R_{11}$, $R_{12}$ and $R_{13}$ each independently represents a hydrogen atom, a substituted or unsubstituted alkyl group, a substituted or unsubstituted aryl group, a substituted or unsubstituted allyl group, a substituted or unsubstituted alkoxy group, a nitro group, a cyano group, an amino group or a halogen atom;

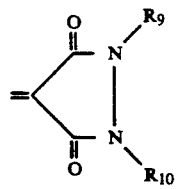

(iii)

wherein $R_9$ and $R_{10}$ are the same as those defined above;

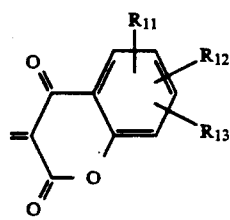

(iv)

wherein $R_{11}$, $R_{12}$ and $R_{13}$ are the same as those define above;

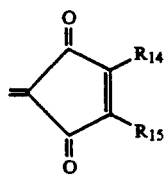

(v)

wherein $R_{14}$ and $R_{15}$ each independently represents a hydrogen atom, a substituted or unsubstituted alkyl group or a substituted or unsubstituted aryl group.

$R_1$ represents a saturated or unsaturated linear or branched alkyl group or its substituted alkyl group, which is commonly known in the cyanine dyes. The alkyl group includes a methyl group, an ethyl group and a propyl group. The substituted alkyl group includes a 2-hydroxyethyl group, a 2-methoxyethyl group, a carboxymethyl group, a 2-carboxyethyl group, a 3-carboxypropyl group, a 2-sulfoethyl group, a 3-sulfopropyl group, a 2-carbomethoxyethyl group, a benzyl group, a phenethyl group, a p-sulfophenethyl group, a p-carboxyphenethyl group and a vinylmethyl group.

$R_2$ and $R_3$ each independently represents a hydrogen atom, a substituted or unsubstituted alkyl group, a substituted or unsubstituted aryl group or a halogen atom.

n represents an integer of 0 to 4.

The present sensitizer represented by the general formula (I) can be prepared by a known method. Typical methods for synthesizing the sensitizer are disclosed in, for instance, "The Theory of Photographic Process," edited by T. H. James, 4th eddition, Published by Macmillan Co., New York (1977) and F. M. Hamer, "The Cyanine Dyes and Related Compounds," Published by John Wiley & Sons Co., New York (1964).

Specific examples of the sensitizer of the formula (I) are as follows:

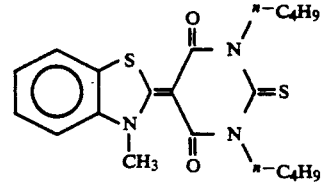

1.

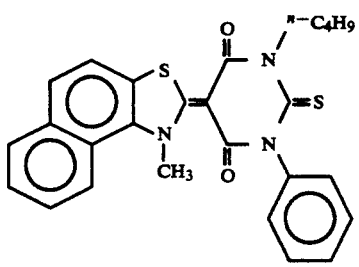

2.

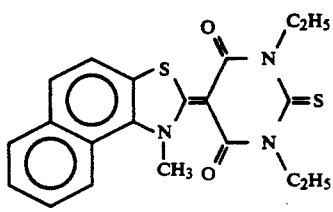

3.

-continued
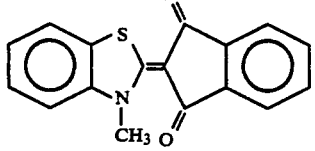
4.
-continued
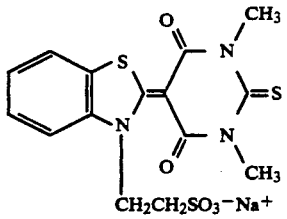
11.
5.
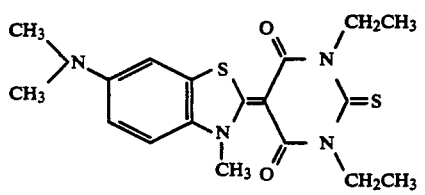
12.
6.
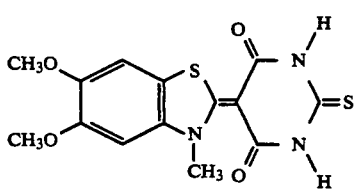
13.
7.
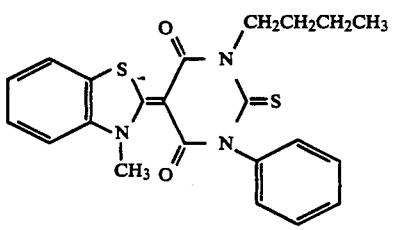
14.
8.
9.
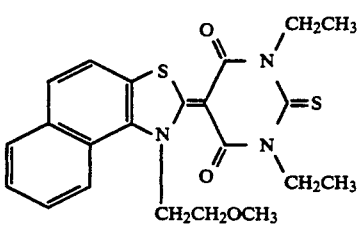
15.
10.
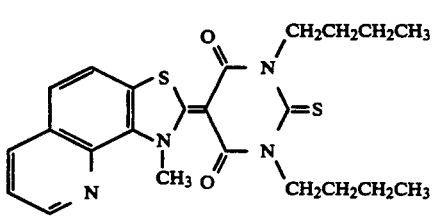
16.
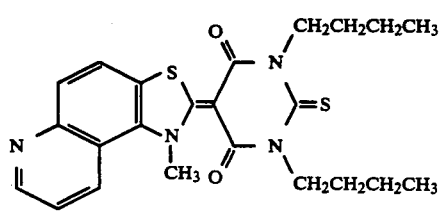
17.

-continued
18. 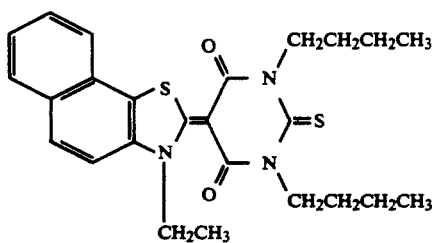
19. 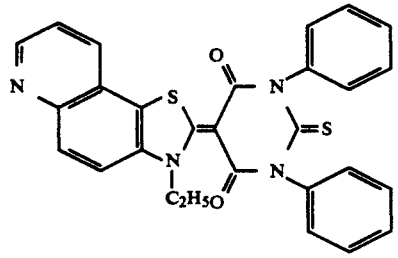
20. 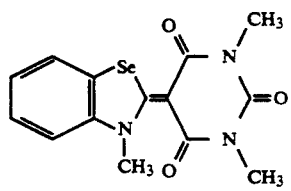
21. 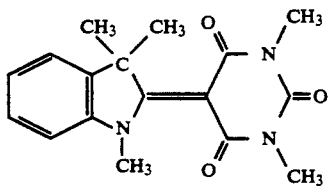
22. 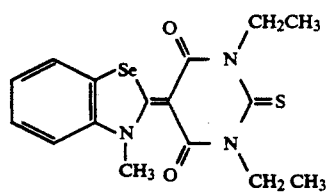
23. 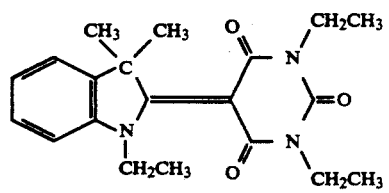
24. 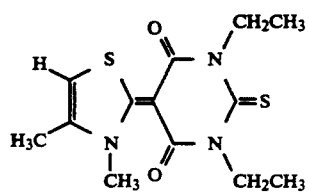
-continued
25. 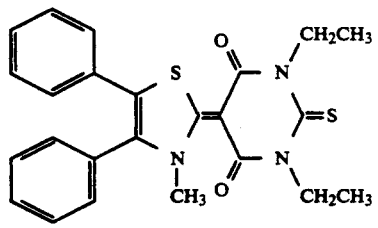
26. 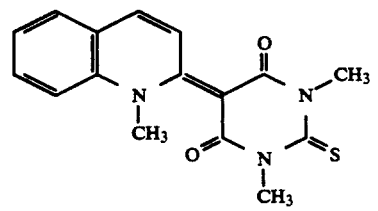
27. 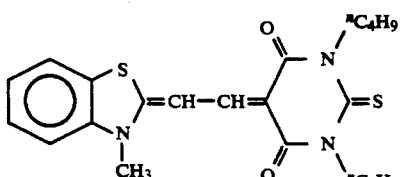
28. 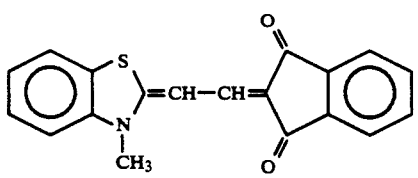
29. 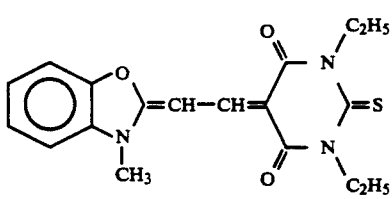
30. 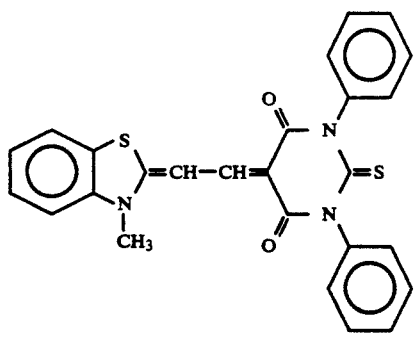
31. 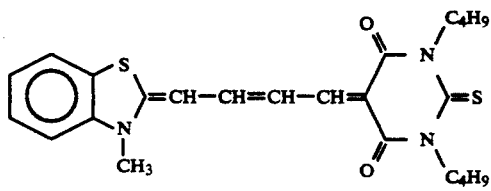
The other sensitizer is represented by the following general formula (II).

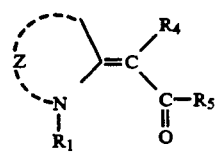

(II)

In the formula (II), Z and $R_1$ are the same as defined in the formula (I).

$R_4$ represents a hydrogen atom, a halogen atom such as a chlorine or bromine atom; a cyano group; or a group —CO—$R_6$ (wherein $R_6$ represents a substituted or unsubstituted an alkyl, aryl or heterocyclic group).

$R_5$ represents a substituted or unsubstituted alkyl, aryl or heterocyclic group such as a methyl group, an ethyl group, a propyl group, a butyl group, a phenyl group, a p-hydroxyphenyl group, a p-methoxyphenyl group, a p-chlorophenyl group, a naphthyl group, a furyl group and a thienyl group.

The thiazoline derivatives which are one of the present sensitizers represented by the general formula (II) include those already known as a sensitizer for azide resins or cinnamic acid ester type light-sensitive resins as disclosed in U.S. Pat. No. 2,948,610; DE OLS No. 2,012,390; and J. P. KOKAI No. Sho 52-129791 (corresponding to U.S. Pat. No. 4,062,686). However, this fact does not substantially adversely affect the spirit of the present invention. This is because light-sensitive compositions having high sensitivity cannot be obtained and thus the object of the present invention cannot be attained even if 5-nitroacetonaphthene, 2-nitrofluorenone, pyrylium salts or thiapyrylium salts which have been known as a sensitizer for azide resins or cinnamic acid ester type light-sensitive materials are used instead of the present sensitizer (b).

Specific examples of the sensitizer represented by the general formula (II) are as follows:

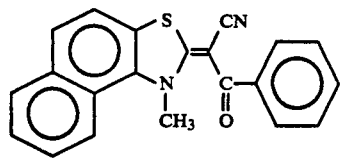

No. 32

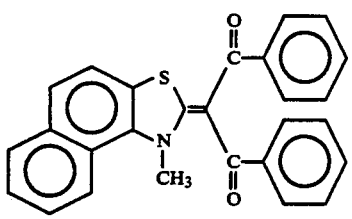

No. 33

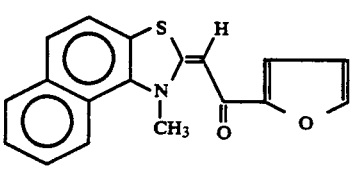

No. 34

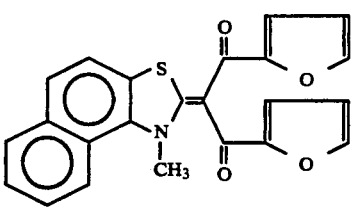

No. 35

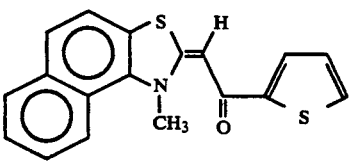

No. 36

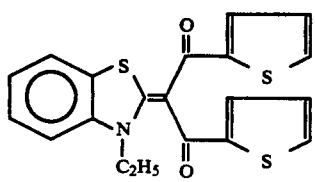

No. 37

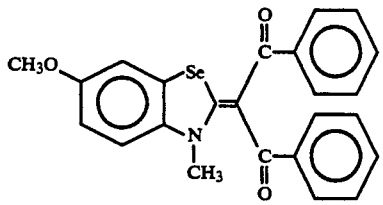

No. 38

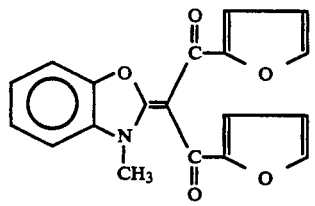

No. 39

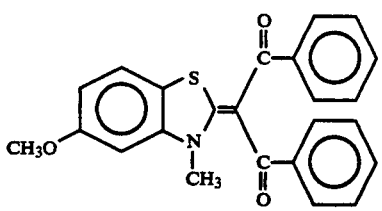

No. 40

The sensitizer represented by the general formula (I) or (II) is generally used in an amount of 1 to 30% and preferably 2 to 10% on the basis of the total weight of the composition.

The photo-crosslinkable light-sensitive composition of the present invention may further comprise the other sensitizers than the present sensitizer(b). The other sensitizers are selected so that the photo-crosslinking rate of the resultant light-sensitive composition is further improved when they are used in combination with the present sensitizer. Specific examples of the other sensitizers are benzoin, benzoin methyl ether, benzoin ethyl ether, 2,2-dimethoxy-2-phenylacetophenone, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t- butyl-9,10-anthraquinone, 2,6-dichloro-9,10-anthraquinone, xanthone, 2-methylxanthone, 2-methoxyxanthone, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone.

In addition, it is also preferred to use, as the other sensitizers, thioxanthone derivatives such as 2-chlorothioxanthone, 2-isopropylthioxanthone and dimethylthioxanthone and substituted thioxanthones such as those disclosed in German Patent Nos. 3,018,891 and 3,117,568; European Patent No. 33,720 and British Patent No. 2,075,506.

The other sensitizer to be used in combination with the present sensitizer (I) or (II) is preferably used in an amount of 0.5 to 20% and more preferably 3 to 10%, on the basis of the total weight of the composition.

The light-sensitive composition of the present invention may optionally comprise a binder which is generally selected from linear organic high molecular weight polymers. Specific examples of such binders are chlorinated polyethylenes, chlorinated polypropylenes, poly-(alkyl acrylates), a copolymer of an alkyl acrylate with at least one monomer selected from the group consisting of acrylonitrile, vinyl chloride, styrene and butadiene, polyamides, methyl cellulose, polyvinyl formal, polyvinyl butyral, methacrylic acid copolymers, acrylic acid copolymers, itaconic acid copolymers, and diazo resins.

In addition, the light-sensitive composition of the present invention preferably comprises a heat polymerization inhibitor. Examples of useful heat polymerization inhibitors are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

The light-sensitive composition of the present invention may optionally comprise dyes or pigments for the purpose of coloring. Specific examples thereof are Methylene Blue, Crystal Violet, Rhodamine B, Fuchsine, Auramine, azo type dyes, anthraquinone type dyes, titanium oxide, carbon black, iron oxide, Phthalocyanine type pigments and/or azo type pigments.

The light-sensitive composition of the present invention is used for making PS plates or photoresist layers by dissolving the foregoing various components in a proper solvent and then applying the resultant solution onto the surface of a suitable substrate in a known manner.

Examples of the solvents to be used when the light-sensitive composition of the present invention is applied to the substrate are ethylene dichloride, cyclohexane, methyl ethyl ketone, methyl cellosolve, ethyl cellosolve, methyl cellosolve acetate, monochlorobenzene, toluene, xylene, propylene glycol monoethyl ether, 3-methoxypropanol, 3-methoxypropyl acetate, ethyl acetate and butyl acetate. These solvents may be used alone or as a combination.

The light-sensitive composition is suitably used as a material for the light-sensitive layer of PS plates. As the substrates suitable for PS plates, there may be listed, for instance, hydrophilized aluminum plates such as silicate-treated aluminum plates, anodized aluminum plates and silicate-electrodeposited aluminum plates as well as zinc plates, stainless steel plates, copper plates subjected to chroming, hydrophilized plastic films and paper.

When the light-sensitive composition is used for making a PS plate, it is coated on the surface of the substrate in an amount suitably ranging from 0.1 to 10.0 g/m$^2$, more preferably 0.5 to 5.0 g/m$^2$ in terms of the amount of the solid contents.

When the light-sensitive composition of the present invention is used as a photoresist, various materials such as copper plates, copper plated plates, stainless steel plates, and glass plates can be used as a substrate.

The present invention will hereunder be explained in more detail with reference to the following non-limitative working Examples.

EXAMPLES 1 TO 6 AND COMPARATIVE EXAMPLES 1 TO 3

An aluminum plate having a thickness of 0.30 mm was grained using a nylon brush and an aqueous suspension of 400 mesh pumice powder and then sufficiently washed with water. The grained aluminum plate was immersed in a 10% sodium hydroxide solution at 70° C. and etched for 60 seconds, washed with running water, neutralized with a 20% HNO$_3$ solution, and then washed with water. The aluminum plate was then electrolytically grained in a 1% aqueous nitric acid solution utilizing alternating sinusoidal current under conditions of 12.7 V of anodic voltage so that the quantity of electricity was 160 coulomb/dm$^2$. The surface roughness of the plate was 0.6µ expressed by center-line average roughness (Ra). Subsequently, the plate was immersed in a 30% aqueous sulfuric acid solution and desmuted at 55° C. for 2 minutes, and then anodized in a 20% aqueous phosphoric acid solution at a current density of 2 A/dm$^2$ for 5 minutes so that the quantity of the resulting anodized layer was 1.2 g/m$^2$. Thereafter, the plate was immersed in a 2.5% aqueous sodium silicate solution maintained at 70° C. for one minute, washed with water and dried.

Each of solutions containing the light-sensitive solutions having the following composition (the sensitizers as used are listed in Table I given below) was applied onto the surface of the resultant aluminum plate using a whirler and dried at 100° C. for 2 minutes to form a light-sensitive layer having a thickness of about 1.5µ (determined after drying), so as to obtain a PS plate.

Light-sensitive Solution

| Component: | Amount (g) |
|---|---|
| 20% Solution of methyl methacrylate/N-[2-(methacryloyloxy)ethyl]-2,3-dimethylmaleimide/ methacrylic acid (molar ratio = 15/65/20) copolymer in a methyl ethyl ketone/2-methoxyethanol (1/1 weight ratio) mixture (Resin V disclosed in J.P. KOKAI No. Sho 59-206425) | 25 |
| Sensitizer listed in Table I | 0.5 |
| F-177 (a fluorine atom-containing nonionic surfactant available from DAINIPPON INK AND CHEMICALS, INC.) | 0.02 |
| Cu-Phthalocyanine pigment (CI Pigment Blue 15) dispersion wherein a 10% plasticizer was used. | 1.0 |
| Methyl ethyl ketone | 20 |
| Methanol | 2 |
| Propylene glycol monomethyl ether | 28 |

The PS plate thus prepared was exposed to light by placing a step wedge (density difference between the adjacent two steps=0.15; number of steps=15) on the plate and irradiating it with light of a 2 KW superhigh pressure mercury lamp for 16 seconds utilizing a vacuum printing frame apparatus (in an ordinary manner). After exposure to light, the plate was developed with a developer having the following composition.

In addition, to examine the sensitivity to light of long wave length, the PS plate was exposed to light from a 500 W xenon lamp through the step wedge and a band pass filter B.P. 43 (having maximum transparency at around 430 nm) for 10 minutes and then developed.

| Developer: | |
|---|---|
| Component | Amount (g) |
| Benzyl alcohol | 4.5 |
| 38% Aqueous solution of sodium isopropyl naphthalene sulphonate | 4.5 |
| Triethanolamine | 1.5 |
| Monoethanolamine | 0.1 |
| Sodium sulfite | 0.3 |
| Pure water | 100 |

The maximum step number of the step wedge corresponding to the developed image is listed in Table I as the sensitivity of each Sample. The higher the step number the higher the sensitivity.

For the purpose of comparison, Comparative Examples (1) and (2) were conducted according to the same procedures as described above except that 2,3-dimethylthioxanthone and Michler's ketone were used respectively in place of the present sensitizer, Comparative Sample (3) was also conducted without using any sensitizer. The sensitivities of Comparative Examples are listed in Table I.

TABLE I

| | Sensitizer of Formula (I) | Maximum Step No. of the Step Wedge | Step No. of the Step wedge upon using B.P. 43 |
|---|---|---|---|
| Ex. No. | | | |
| 1 | No. 1 | 10 | 5 |
| 2 | No. 2 | 10 | 5 |
| 3 | No. 4 | 9 | 4 |
| 4 | No. 6 | 10 | 4 |
| 5 | No. 27 | 9 | 5 |
| 6 | No. 29 | 9 | 5 |
| Comp. Ex. | | | |
| 1 | 2,3-dimethylthioxanthone | 9 | 2 |
| 2 | Michler's ketone | 2 | 0 |
| 3 | — | 0 | 0 |

As shown in Table I, the light-sensitive composition of the present invention in which the sensitizer represented by the general formula (I) was used shows high sensitivity even to light of long wave length as compared with the light-sensitive compositions of Comparative Examples 1 to 3.

EXAMPLES 7 TO 9 AND COMPARATIVE EXAMPLES 4 TO 6

The same procedures as in Examples 1 to 6 were repeated except that the compounds listed in Table II were used as the present sensitizers represented by the general formula (I) and that 0.3 g of ethyl 7-methylthioxanthone-3-carboxylate was added as an additional sensitizer other than the present sensitizer to form a coating light-sensitive solution. Likewise, PS plates was prepared, exposed to light and developed. The maximum step number of the step wedge corresponding to the developed image is listed in Table II as the sensitivity of each Sample.

For the purpose of comparison, Comparative Examples (4) and (5) were conducted according to the same procedures as described above except that Michler's ketone and benzophenone were used respectively in place of the present sensitizer. Comparative Example (6) was also prepared by using only ethyl 7-methylthioxanthone-3-carboxylate as a sensitizer. The sensitivities of Comparative Examples are also listed in Table II.

TABLE II

| | Sensitizer | Sensitizer Formula (I) | Maximum Step No. of the Step Wedge |
|---|---|---|---|
| Ex. No. | | | |
| 7 | Ethyl 7-methylthioxanthone-3-carboxylate (0.3 g) | No. 1 | 11 |
| 8 | Ethyl 7-methylthioxanthone-3-carboxylate (0.3 g) | No. 2 | 11 |
| 9 | Ethyl 7-methylthioxanthone-3-carboxylate (0.3 g) | No. 6 | 11 |
| Comp. Ex. | | | |
| 4 | Ethyl 7-methylthioxanthone-3-carboxylate (0.3 g) | Michler's ketone | 8 |
| 5 | Ethyl 7-methylthioxanthone-3-carboxylate (0.3 g) | benzophenone | 9 |
| 6 | Ethyl 7-methylthioxanthone-3-carboxylate (0.3 g) | — | 9 |

As seen from the results listed in Table II, the light-sensitive composition of the present invention in which the sensitizer represented by the formula (I) and a conventional sensitizer (ethyl 7-methylthioxanthone-3-carboxylate) were simultaneously used exhibits extremely high sensitivity as compared with the composition of Comparative Example 6 in which the conventional sensitizer was used alone and those of Comparative Examples 4 and 5 in which ethyl 7-methylthioxanthone-3-carboxylate and another conventional sensitizer were simultaneously used.

EXAMPLE 10

The same procedures as in Examples 1 to 6 were repeated to obtain an aluminum plate as a substrate except that the plate was anodized at a current density of 2 A/dm$^2$ in a 20% aqueous sulfuric acid solution for 2 minutes to thus form an anodized layer having a thickness of 2.0 g/m$^2$ and then treated with sodium silicate, instead of the anodization employed in Examples 1 to 6.

A light-sensitive solution having the following composition was applied onto the surface of the aluminum plate using a whirler and dried at 100° C. for 2 minutes to form a light-sensitive layer having a thickness of 1.5μ (determined after drying) to thus obtain a PS plate.

Light-sensitive Solution

| Component: | Amount (g) |
|---|---|
| 20% Solution of methyl methacrylate/N-[2-(methacryloyloxy)ethyl]-2,3-dimethylmaleimide/methacrylic acid (molar ratio = 15/65/20) copolymer in a methyl ethyl ketone/2-methoxyethanol (1/1 weight ratio) mixture | 25 |
| Sensitizer No. 1 (Formula (I)) | 0.1 |
| PF$_6$ Salt of the condensate of p-diazodiphenyl amine | 0.05 |

| Component: | Amount (g) |
|---|---|
| with formaldehyde F-177 | 0.02 |
| Cu-Phthalocyanine pigment (Cl Pigment Blue 15) dispersion wherein a 10% plasticizer was used | 1.0 |
| Methyl ethyl ketone | 20 |
| Methanol | 5 |
| Ethylene glycol monomethyl ether | 30 |

The exposure to light and the development were performed as in Examples 1 to 6. The maximum step number of the step wedge was 9.

EXAMPLES 11 to 15 AND COMPARATIVE EXAMPLES 7 to 9

The same procedures as in Examples 1 to 6 were repeated except that ethylene glycol monomethyl ether acetate was used instead of propylene glycol monomethyl ether and the sensitizers represented by the general formula (II) listed in Table III were used instead of those represented by the general formula (I) in the light-sensitive solution. The maximum step number of the step wedge corresponding to the images appeared were listed in Table III as the sensitivities of those examples.

TABLE III

| | Sensitizer of Formula (II) | Maximum Step No. of the Step Wedge |
|---|---|---|
| Ex. No. | | |
| 11 | No. 32 | 11 |
| 12 | No. 33 | 10 |
| 13 | No. 35 | 11 |
| 14 | No. 37 | 10 |
| 15 | No. 40 | 10 |
| Comp. Ex. | | |
| 7 | 2,3-Diethylthioxanthone | 8 |
| 8 | Michler's ketone | 2 |
| 9 | — | 0 |

As seen from the results listed in Table III, the light-sensitive composition of the present invention in which the sensitizer represented by the general formula (II) was incorporated exhibited high sensitivity as compared with those of Compatative Examples in which a conventional sensitizer, 2,3-diethylthioxanthone or Michler's ketone was used or that free of sensitizers (Comparative Example 9).

As has been explained above in detail, the light-sensitive composition of the present invention exhibits high sensitivity. Therefore, the composition makes it possible to form images by exposing to light for a very short period of time and has excellent workability in, for instance, plate-making processes.

Moreover, the composition of the present invention can be sensitive to light of long wave length and thus a variety of light sources can be used for imagewise exposure.

What is claimed is:

1. A light-sensitive composition which comprises:
   (a) a photo-crosslinkable polymer having a maleimido group at a side chain, and
   (b) a sensitizer selected from the group consisting of those represented by the following general formulae (I) and (II):

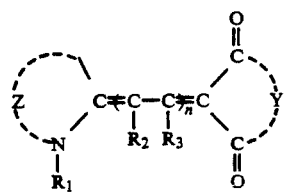

(I)

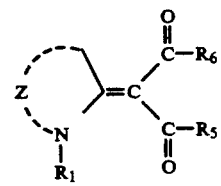

(II)

wherein Z represents a group of nonmetallic atoms required for forming a heterocyclic nucleus containing a nitrogen atom; Y represents a group of nonmetallic atoms required for forming a ring; $R_1$ represents a substituted or unsubstituted alkyl group; $R_2$ and $R_3$ may be the same as or different from each other and each represents a hydrogen atom, an alkyl group having one to three carbon atoms, or a halogen atom; $R_5$ and $R_6$ may be the same or different and each represents an alkyl, aryl or heterocyclic group; and n is an integer of 0 to 4, wherein said photo-crosslinkable polymer is selected from polymers having, at a side chain, a maleimido group represented by the following general formula (A):

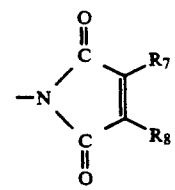

(A)

wherein $R_7$ and $R_8$ may be the same or different from each other and such represents a hydrogen atom, a halogen atom or an alkyl group, provided that $R_7$ and $R_8$ may form a 5-membered or 6-membered ring and which polymer is prepared by copolymerizing a monomer selected from the group consisting of those represented by the following general formulae (B) to (D):

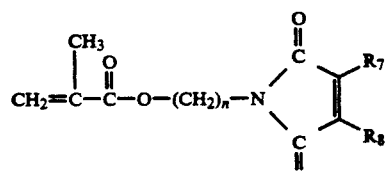

(B)

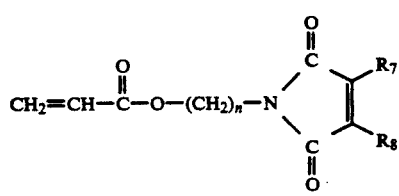

(C)

-continued

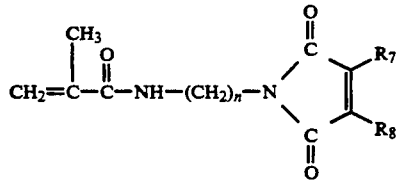
(D)

wherein $R_7$ and $R_8$ each has the same meaning as those defined above and n is an integer of 1 to 6, with a monomer having an alkali-soluble group in a molecule at a molar ratio of 95/5 to 30/70.

2. The light-sensitive composition of claim 1 wherein said monomer having an alkali-soluble group in a molecule is selected from vinyl monomers having a carboxylic acid group, maleic anhydride and itaconic anhydride.

3. The light-sensitive composition of claim 1 wherein the molecular weight of said photo-crosslinkable polymer is 1,000 or higher.

4. The light-sensitive composition of claim 3 wherein the molecular weight of said photo-crosslinkable polymer is 10,000 to 500,000.

5. The light-sensitive composition of claim 1 wherein the amount of said polymer (a) is 10 to 99% by weight on the basis of the total weight of the light-sensitive composition.

6. The light-sensitive composition of claim 5 wherein the amount of said polymer (a) is 50 to 99% by weight on the basis of the total weight of the light-sensitive composition.

7. The light-sensitive composition of claim 1 wherein Z is a member selected from the group of non-metallic atoms required for forming benzothiazone, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-hydroxybenzothiazole, 5,6-dimethylbenzothiazole, 5,6-dimethoxybenzothiazole), α-naphthothiazole, β-naphthothiazole, benzoselenazole, 5-chlorobenzoselenazole, 6-methylbenzoselenazole, 6-methoxybenzoselenazole, α-naphthoselebazole, β-naphthoselenazole, benzoxazole, α-naphthoxazole, β-naphthoxazole, imidazole, benzimidazole, 3,3-dimethylindolenine, quinoline, isoquinoline, 1,3,4-oxadiazole, 1,3,4-thiadiazole, 1,3,4-selenadiazole, 1,2,4-triazole, pyrazine, quinoxaline, s-triazine or phenanthridine.

8. The light-sensitive composition of claim 1 wherein Y is selected from the group of non-metallic atoms required for forming the following structures (i) to (v):

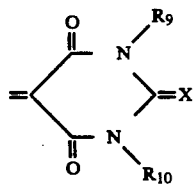
(i)

wherein $R_9$ and $R_{10}$ each independently represents a hydrogen atom, a substituted or unsubstituted alkyl group, a substituted or unsubstituted aryl group or a substituted or unsubstituted allyl group and X represents an oxygen or sulfur atom;

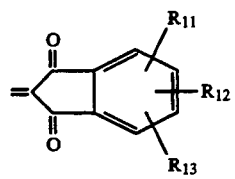
(ii)

wherein $R_{11}$, $R_{12}$ and $R_{13}$ each independently represents a hydrogen atoms, a substituted or unsubstituted alkyl group, a substituted or unsubstituted aryl group, a substituted or unsubstituted allyl group, a substituted or unsubstituted alkoxy group, a nitro group, a cyano group, an amino group or a halogen atom;

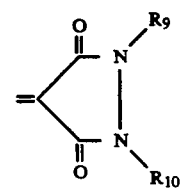
(iii)

wherein $R_9$ and $R_{10}$ are the same as those defined above;

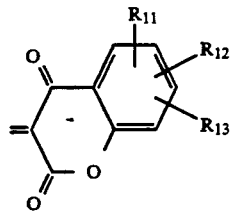
(iv)

wherein $R_{11}$, $R_{12}$ and $R_{13}$ are the same as those defined above;

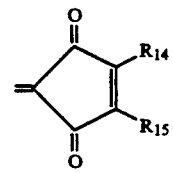
(v)

wherein $R_{14}$ and $R_{15}$ each independently represents a hydrogen atom, a substituted or unsubstituted alkyl group or a substituted or unsubstituted aryl group.

9. The light-sensitive composition of claim 1 wherein $R_1$ represents a methyl group, an ethyl group, a propyl group, a 2-hydroxyethyl group, a 2-methoxyethyl group, a carboxymethyl group, a 2-carboxyethyl group, a 3-carboxypropyl group, a 2-sulfoethyl group, a 3-sulfopropyl group, a 2-carbomethoxyethyl group, a benzyl group, a phenethyl group, a p-sulfophenethyl group, a p-carboxyphenethyl group or a vinylmethyl group.

10. The light-sensitive composition of claim 1 wherein $R_5$ represents a methyl group, an ethyl group, a propyl group, a butyl group, a phenyl group, a p-hydroxyphenyl group, a p-methoxyphenyl group, a p-chlorophenyl group, a naphthyl group, a furyl group or a thienyl group.

11. The light-sensitive composition of claim 1 wherein said sensitizer is selected from the group consisting of:

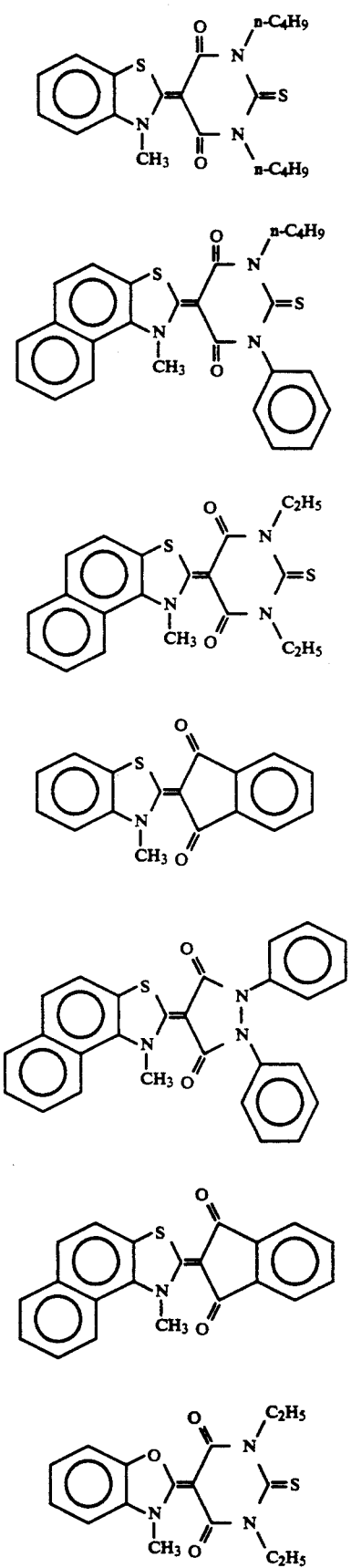
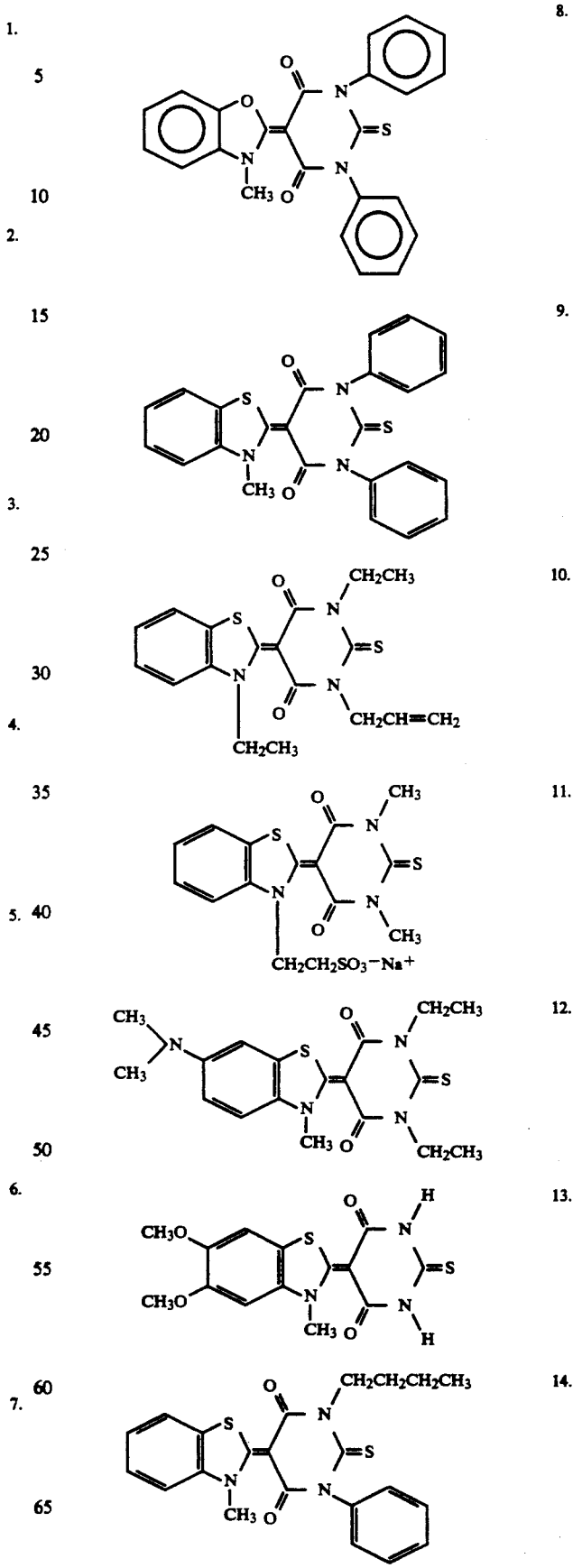

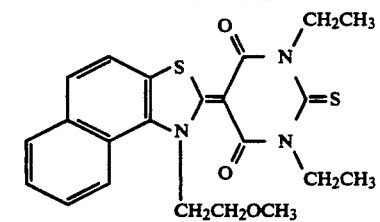 15.
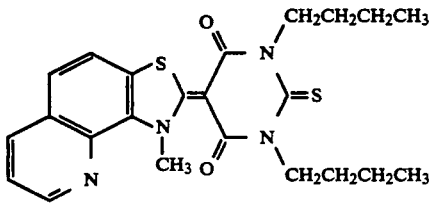 16.
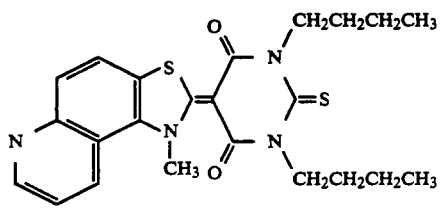 17.
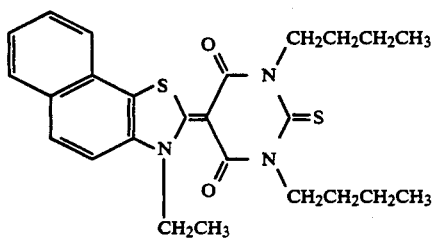 18.
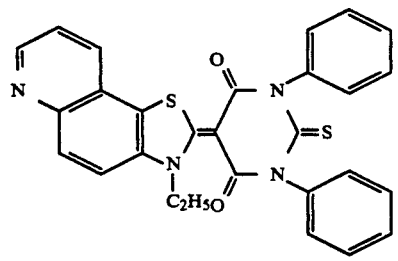 19.
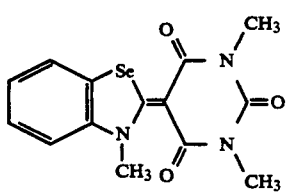 20.
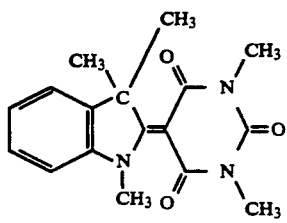 21.
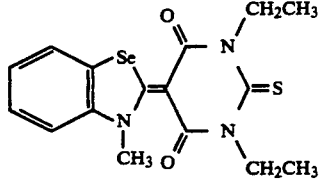 22.
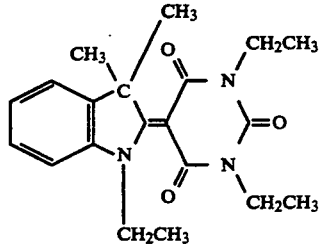 23.
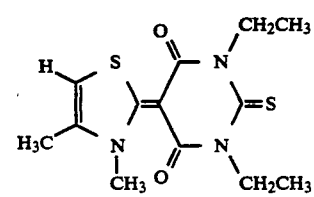 24.
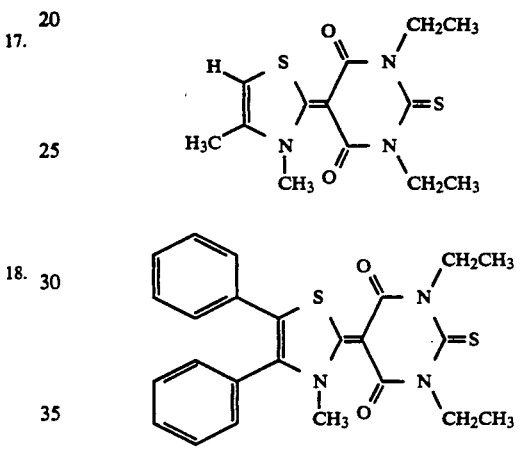 25.
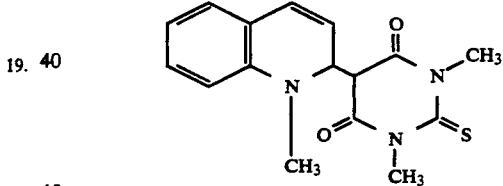 26.
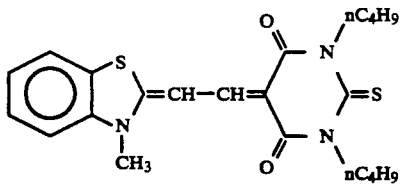 27.
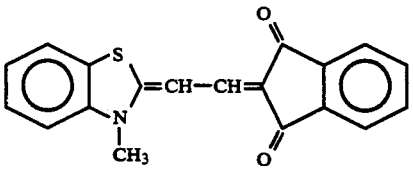 28.
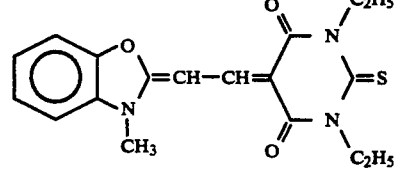 29.

12. The light-sensitive composition of claim 1 further comprising other sensitizers than those represented by the general formulae (I) and (II) selected from benzoin, benzoin methyl ether, benzoin ethyl ether, 2,2-dimethoxy-2-phenylacetophenone, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, dibenzalacetone, p-(dimethylamino)phenyl styryl ketone, p-(dimethylamino)phenyl p-methylstyryl ketone, benzophenone, p-(dimethylamino)benzophenone, p-(diethylamino)benzophenone, and benzanthrone.

* * * * *